(12) United States Patent
Tanaka et al.

(10) Patent No.: US 10,870,738 B2
(45) Date of Patent: Dec. 22, 2020

(54) POLYESTER SHEET

(71) Applicant: MITSUI CHEMICALS, INC., Tokyo (JP)

(72) Inventors: Masakazu Tanaka, Yokohama (JP); Toyoaki Sasaki, Narashino (JP); Yasuhito Tsugane, Tokyo (JP); Kenkichi Yoshida, Ichihara (JP); Kenjiro Takamine, Ichihara (JP); Masahiko Okamoto, Chiba (JP); Takanori Tada, Ichihara (JP)

(73) Assignee: MITSUI CHEMICALS, INC., Tokyo (JP)

( * ) Notice: Subject to any disclaimer, the term of this patent is extended or adjusted under 35 U.S.C. 154(b) by 30 days.

(21) Appl. No.: 16/466,279

(22) PCT Filed: Dec. 13, 2017

(86) PCT No.: PCT/JP2017/044717
§ 371 (c)(1),
(2) Date: Jun. 3, 2019

(87) PCT Pub. No.: WO2018/123592
PCT Pub. Date: Jul. 5, 2018

(65) Prior Publication Data
US 2020/0071475 A1    Mar. 5, 2020

(30) Foreign Application Priority Data
Dec. 27, 2016 (JP) ................................. 2016-253402

(51) Int. Cl.
| | | |
|---|---|---|
| *C08J 5/18* | (2006.01) | |
| *C08F 10/14* | (2006.01) | |
| *C08L 67/02* | (2006.01) | |
| *H01L 31/056* | (2014.01) | |
| *F21V 7/24* | (2018.01) | |
| *G02B 5/08* | (2006.01) | |
| *G02F 1/1335* | (2006.01) | |

(52) U.S. Cl.
CPC .............. *C08J 5/18* (2013.01); *C08F 10/14* (2013.01); *C08L 67/02* (2013.01); *C08J 2367/02* (2013.01); *C08J 2423/20* (2013.01); *C08J 2455/00* (2013.01); *C08L 2203/20* (2013.01); *C08L 2203/204* (2013.01); *C08L 2205/03* (2013.01); *C08L 2205/08* (2013.01); *F21V 7/24* (2018.02); *G02B 5/08* (2013.01); *G02F 1/133553* (2013.01); *H01L 31/056* (2014.12)

(58) Field of Classification Search
USPC ......................................................... 525/445
See application file for complete search history.

(56) References Cited

U.S. PATENT DOCUMENTS

| | | | |
|---|---|---|---|
| 5,672,409 A | 9/1997 | Miyakawa et al. | |
| 5,844,731 A | 12/1998 | Kabumoto et al. | |
| 5,968,666 A | 10/1999 | Carter et al. | |
| 6,203,921 B1 | 3/2001 | Carter et al. | |
| 2009/0042016 A1 | 2/2009 | Yoshida et al. | |
| 2011/0160425 A1 | 6/2011 | Kim et al. | |
| 2011/0165416 A1 | 7/2011 | Kawabe et al. | |
| 2014/0248488 A1 | 9/2014 | Kawabe et al. | |
| 2015/0239996 A1 | 8/2015 | Funaya et al. | |
| 2016/0376385 A1 | 12/2016 | Funaya et al. | |
| 2017/0327610 A1 | 11/2017 | Funaya et al. | |
| 2017/0327611 A1 | 11/2017 | Funaya et al. | |
| 2019/0048109 A1 | 2/2019 | Tanaka et al. | |

FOREIGN PATENT DOCUMENTS

| | | |
|---|---|---|
| EP | 0 888 217 A1 | 1/1999 |
| JP | H04-239540 A | 8/1992 |
| JP | 2002-363321 A | 12/2002 |
| JP | 2002-363322 A | 12/2002 |
| JP | 2004-123784 A | 4/2004 |
| JP | 2004-330727 A | 11/2004 |
| JP | 2009-040045 A | 2/2009 |
| JP | 2014-181312 A | 9/2014 |
| JP | 2014-185241 A | 10/2014 |
| JP | 2015-183141 A | 10/2015 |
| JP | 2015-183332 A | 10/2015 |
| JP | 2015-214663 A | 12/2015 |
| JP | 2016-045390 A | 4/2016 |
| JP | 2016-098257 A | 5/2016 |
| JP | 2016-147980 A | 8/2016 |
| JP | 2017-193646 A | 10/2017 |
| WO | WO-97/01117 A1 | 1/1997 |
| WO | WO-97/32726 A1 | 9/1997 |
| WO | WO-2008/053740 A1 | 5/2008 |

(Continued)

OTHER PUBLICATIONS

International Searching Authority, "International Search Report," in connection with International Patent Application No. PCT/JP2017/044717, dated Feb. 27, 2018.

(Continued)

*Primary Examiner* — Terressa Boykin
(74) *Attorney, Agent, or Firm* — Foley & Lardner LLP

(57) ABSTRACT

A polyester sheet including a polyester (A), a 4-methyl-1-pentene polymer (B) having a specific heat of fusion and a meso diad fraction (m) of 98.5 to 100%, and a compatibilizing agent (C), wherein content proportions of the (A), (B), and (C) are 60 to 98.9 parts by mass for (A), 1 to 25 parts by mass for (B), and 0.1 to 15 parts by mass for (C), when a total content of (A), (B), and (C) is set as 100 parts by mass, and wherein (B) satisfies the requirements (a) to (d) described herein.

10 Claims, No Drawings

(56) References Cited

FOREIGN PATENT DOCUMENTS

| WO | WO-2010/005072 A1 | 1/2010 |
| WO | WO-2014/050817 A1 | 4/2014 |
| WO | WO-2017/150265 A1 | 9/2017 |

OTHER PUBLICATIONS

International Searching Authority, "Written Opinion," in connection with International Patent Application No. PCT/JP2017/044717, dated Feb. 27, 2018.
First Examination Report dated Aug. 7, 2020 for corresponding Indian Patent Application No. 201917030093.

POLYESTER SHEET

RELATED APPLICATIONS

The present application claims priority under 37 U.S.C. § 371 to International Patent Application No. PCT/JP2017/044717, filed Dec. 13, 2017, which claims priority to and the benefit of Japanese Patent Application No. 2016-253402, filed on Dec. 27, 2016. The contents of these applications are hereby incorporated by reference in their entireties.

TECHNICAL FIELD

The present invention relates to a polyester sheet having excellent light reflection performance.

BACKGROUND ART

On a display device such as a liquid crystal display or an illuminated sign, images can be clearly shown by irradiating light from the back surface. However, as lighter and thinner display devices as being demanded, display devices have shifted to a backlight systems in which light from a peripheral portion is reflected by a reflective plate or a reflective sheet and is irradiated from the back surface are mainstream instead of system in which the light source is provided directly on the back surface. In order to improve display performance while achieving further reductions in weight and thickness, there is a need for the reflective plate or reflective sheet to be thin and lightweight, and have excellent mechanical strength, high reflectance, and also excellent light scuttering properties.

As the reflective plate and reflective sheet of surface light source devices in a flat type image display system such as a liquid crystal display, the back reflective sheet of an illuminated sign, the back reflective sheet of a solar cell, and the like, polyester sheets containing fine particles or pores are used for the reason that such polyester sheets have good light reflectivity, are inexpensive, and also have excellent dimensional stability.

Examples of methods for obtaining a polyester sheet having a light reflection performance include a method of mixing a large number of inorganic particles, such as barium sulfate, in a polyester sheet and utilizing the light reflection at the interfaces of the inorganic particles with the polyester and the interfaces of the fine pores formed around the fine particles as cores (refer to Patent Literature 1), a method of mixing a resin incompatible with a polyester and utilizing the light reflection at the interfaces of the resin incompatible with the polyester and the interfaces of the fine pores formed around the incompatible resin as cores (refer to Patent Literature 2), and a method of impregnating a polyester with an inert gas in a pressure vessel to form a large number of fine pores in the interior of the polyester and utilizing the light reflection at the interfaces of the pores with the polyester (refer to Patent Literature 3), and the like.

However, for a polyester sheet using inorganic particles such as titanium oxide, there is a limit to the level of improvement in the reflectance, and since the inorganic particles tend to absorb a specific wavelength, there is a problem in that the reflectance of the light in the wavelength region corresponding to that specific wavelength deteriorates, thereby darkening the screen. In addition, when the interior pores are large, not only is the light reflection performance insufficient, but there is also a problem in that the mechanical strength may be inferior.

In particular, for liquid crystal displays widely used for mobile terminals, liquid crystal televisions, and the like, there is a constant need to increase the luminance of the screen and to reduce power consumption, and for the reflective sheet as well, there is a need to improve the light reflection performance. In order to improve the light reflection performance of the polyester sheet, it is necessary to increase the light reflecting interfaces in the polyester film. Therefore, efforts have been made to form finer and more numerous pores. For example, in order to finely disperse a resin incompatible with the polyester, there has been proposed a white polyester film formed using a styrene elastomer as a compatibilizing agent (see Patent Literature 4 and 5).

However, in the white polyester sheet disclosed in Patent Literature 4 and Patent Literature 5, since the size of the dispersion phase of the incompatible resin in the polyester is large, it is difficult to satisfy the high degree of light reflection performance required in recent years. In addition, since a multilayer structure is essential, there is a problem in that the production process is complicated and not economical.

On the other hand, Patent Literature 6 proposes a polyester sheet using a 4-methyl-1-pentene resin. There are provided a polyester resin composition capable of forming a sheet exhibiting a higher degree of light reflection performance by more finely dispersing in the polyester an incompatible 4-methyl-1-pentene resin component, and a molded article and a polyester sheet suitable as a reflective sheet and the like.

DOCUMENTS OF RELATED ART

Patent Documents

Patent Literature 1: JP-A-2004-330727
Patent Literature 2: JP-A-04-239540
Patent Literature 3: WO 97/01117(A1)
Patent Literature 4: JP-A-2004-123784
Patent Literature 5: JP-A-2009-40045
Patent Literature 6: JP-A-2015-214663

SUMMARY OF THE INVENTION

Problems to be Solved by the Invention

It is an object of the present invention to provide a polyester sheet having better light reflection performance than a conventional polyester sheet while maintaining the excellent properties, such as high mechanical strength, dimensional stability, and durability, inherent in polyester.

Means for Solving the Problem

As a result of diligent studies, the present inventors have completed the present invention by finding that the problems described above can be solved with a polyester sheet composed of a resin composition comprising a polyester (A), a 4-methyl-1-pentene polymer (B) satisfying specific requirements, and a compatibilizing agent (C) in specific proportions.

Specifically, the present invention relates to the following [1] to [10].
[1] A polyester sheet comprising a polyester (A), a 4-methyl-1-pentene polymer (B), and a compatibilizing agent (C), wherein content proportions of the (A), (B), and (C) are 60 to 98.9 parts by mass for (A), 1 to 25 parts by mass for (B), and 0.1 to 15 parts by mass for (C), when a total content of (A), (B), and (C) is set as 100 parts by mass, and wherein the (B) satisfies the following requirements (a) to (d):

(a) an amount of a constitutional unit derived from 4-methyl-1-pentene is 100 to 90% by mol and a total amount of a constitutional unit derived from at least one α-olefin selected from ethylene and an α-olefins having 3 to 20 carbon atoms (except for 4-methyl-1-pentene) is 0 to 10% by mol;

(b) a heat of fusion ΔHm (units: J/g) and a melting point Tm (units: ° C.) measured by differential scanning calorimetry (DSC) satisfy the following requirements (1) and (2):

(1) $\Delta Hm \geq 0.5 \times Tm - 76$ (2) Melting point Tm: 200 to 260° C.;

(c) a melt flow rate (MFR) measured under conditions of 260° C. and a 5 kg load in conformity to ASTM D1238 is 0.1 to 500 g/10 min; and (d) a meso diad fraction (m) measured by $^{13}$C-NMR is 98.5 to 100%.

[2] The polyester sheet according to [1], wherein the (B) satisfies at least one of the following requirements (e) and (f):

(e) a Vicat softening temperature measured at a rate of temperature increase of 50° C./hr at a test load of 10 N in a silicone oil in conformity to ASTM D1525 is 145 to 220° C.; and (f) an amount of a decane-soluble portion at 23° C. is 5.0% by weight or less.

[3] The polyester sheet according to [1] or [2], wherein the 4-methyl-1-pentene polymer (B) has a melting point Tm of 230 to 245° C.

[4] The polyester sheet according to any one of [1] to [3], wherein the polyester (A) is polyethylene terephthalate.

[5] The polyester sheet according to any one of [1] to [4], wherein the polyester sheet is obtained through a stretching process.

[6] The polyester sheet according to any one of [1] to [5], wherein the (C) is a polar group-modified styrene elastomer.

[7] The polyester sheet according to [6], wherein the polar group-modified styrene elastomer is a polar group-modified styrene-ethylene/butylene-styrene copolymer.

[8] The polyester sheet according to [6] or [7], wherein the polar group-modified styrene elastomer (C) has a styrene content falling within the range of 5 to 20% by mass.

[9] The polyester sheet according to any one of [1] to [8], wherein the polyester sheet is a biaxially stretched sheet.

[10] The polyester sheet according to any one of [1] to [9], wherein the polyester sheet is a reflective sheet of a liquid crystal display, an illuminated sign, or a solar cell.

Effect of the Invention

The polyester sheet of the present invention has the mechanical strength, dimensional stability, durability, and the like inherent to polyester, and exhibits a high degree of light reflectance.

DETAILED DESCRIPTION OF THE INVENTION

Hereinafter, the present invention will be described in detail.

Polyester Sheet

The polyester sheet of the present invention contains a polyester (A), a 4-methyl-1-pentene polymer (B), and a compatibilizing agent (C) as essential components. The content proportions of these components are: 60 to 98.9 parts by mass, preferably 60 to 94 parts by mass for (A); 1 to 25 parts by mass, preferably 5 to 25 parts by mass for (B); and 0.1 to 15 parts by mass, preferably 1 to 15 parts by mass for (C), when a total content of (A), (B), and (C) is set as 100 parts by mass.

Hereinafter, these components and components that may optionally be added are described.

(Polyester (A))

The polyester (A) used in the present invention can be produced by polymerizing a monomer including a dicarboxylic acid and a diol in the presence of a known polyester polymerization catalyst, such as an antimony catalyst, a germanium catalyst, and a titanium-based catalyst.

Representative examples of the dicarboxylic acid component include, as aromatic dicarboxylic acids, terephthalic acid, isophthalic acid, 5-sodium sulfoisophthalic acid, phthalic acid, diphenic acid, and ester derivatives thereof, as aliphatic dicarboxylic acids, adipic acid, sebacic acid, dodecadionic acid, eicosane diacid, dimer acid, and ester derivatives thereof, as alicyclic dicarboxylic acids, 1,4-cyclohexanedicarboxylic acid and ester derivatives thereof, and as polyfunctional acids, trimellitic acid, pyromellitic acid, and ester derivatives thereof.

Representative examples of the diol component include polyethers such as ethylene glycol, propanediol, butanediol, neopentyl glycol, pentanediol, hexanediol, octanediol, decanediol, cyclohexanedimethanol, diethylene glycol, triethylene glycol, polyethylene glycol, tetramethylene glycol, and polytetramethylene glycol.

In consideration of mechanical strength, heat resistance, production costs, and the like, it is preferable that the polyester (A) used in the present invention be a polyester having polyethylene terephthalate as a basic structure.

(4-Methyl-1-Pentene Polymer (B))

The 4-methyl-1-pentene polymer (B) according to the present invention satisfies the following requirements (a) to (d), and may preferably also further satisfy one or more of the following requirements (e) and (f) as necessary.

Each requirement will now be described below.

(Requirement (a))

In the 4-methyl-1-pentene polymer (B) according to the present invention, an amount of a constitutional unit derived from 4-methyl-1-pentene is 100 to 90% by mol and an amount of a constitutional unit derived from at least one olefin selected from ethylene and an α-olefins having 3 to 20 carbon atoms (except for 4-methyl-1-pentene) is 0 to 10% by mol.

Examples of the 4-methyl-1-pentene polymer (B) according to the present invention include homopolymers of 4-methyl-1-pentene (i.e., case in which the amount of the constitutional unit derived from 4-methyl-1-pentene is 100% by mol) and copolymers of 4-methyl-1-pentene and other olefins. As long as the effects of the present invention are exhibited, 4-methyl-1-pentene polymer (B) includes both of these meanings.

The amount of the constitutional unit derived from the 4-methyl-1-pentene in the 4-methyl-1-pentene polymer (B) according to the present invention is preferably 92 to 100% by mol, and more preferably 95 to 100% by mol, and the total amount of a constitutional unit derived from at least one olefin selected from ethylene and α-olefins having 3 to 20 carbon atoms (except for 4-methyl-1-pentene) is preferably 0 to 8% by mol, and more preferably 0 to 5% by mol.

When the 4-methyl-1-pentene polymer (B) according to the present invention is a copolymer, specific examples of the α-olefin having 3 to 20 carbon atoms to be copolymerized with 4-methyl-1-pentene include propylene, 1-butene, 1-pentene, 3-methyl-1-butene, 1-hexene, 3-methyl-1-pentene, 3-ethyl-1-pentene, 4,4-dimethyl-1-pentene, 4-methyl-1-hexene, 4,4-dimethyl-1-hexene, 4-ethyl-1-hexene, 3-ethyl-1-hexene, 1-octene, 1-decene, 1-dodecene, 1-tetradecene, 1-hexadecene, 1-octadecene and 1-eicosene. Among these, preferable are α-olefins having 6 to 20 carbon atoms excluding 4-methyl-1-pentene, and more preferable are α-olefins having 8 to 20 carbon atoms. These α-olefins can be used alone or in combination of two or more thereof.

The amounts of the constitutional unit derived from the 4-methyl-1-pentene and the constitutional unit derived from at least one olefin selected from ethylene and α-olefins having 3 to 20 carbon atoms (except for 4-methyl-1-pentene) in the 4-methyl-1-pentene polymer (B) according to the present invention can be adjusted by the amounts of each of the olefins to be added during the polymerization reaction.

(Requirement (b))

In the present invention, the 4-methyl-1-pentene polymer (B) has a heat of fusion ΔHm (units: J/g) and a melting point Tm (units: °C.) measured by differential scanning calorimetry (DSC) satisfying the following requirements (1) and (2).

(1) ΔHm≥0.5×Tm−76
(2) Melting point Tm: 200 to 260° C.;

The heat of fusion ΔHm measured by differential scanning calorimetry (DSC) (rate of temperature increase: 10° C./min) in the requirement (1) described above is preferably 5 to 80 J/g, and more preferably 10 to 60 J/g. Further, the melting point Tm measured by differential scanning calorimetry (DSC) (rate of temperature increase: 10° C./min) in the requirement (2) described above is preferably 210 to 245° C., more preferably 215 to 240° C., and even more preferably 220 to 235° C.

The requirement (1) described above indicates that the 4-methyl-1-pentene polymer (B) according to the present invention has a higher heat of fusion than conventionally known 4-methyl-1-pentene polymers. Specifically, the 4-methyl-1-pentene polymer (B) according to the present invention is characterized by having a larger heat of fusion (ΔHm) at about the same melting point (Tm), namely, a higher degree of crystallinity, than conventionally known 4-methyl-1-pentene polymers such as the 4-methyl-1-pentene-decene-1 copolymer described in Examples of Patent Literature 6. Since the conventionally known 4-methyl-1-pentene polymers generally have a high melting point but a small heat of fusion, the 4-methyl-1-pentene polymer (B) according to the present invention can be said to exhibit excellent properties.

It was found that when the 4-methyl-1-pentene polymer (B) satisfies the requirement (1), the pore opening ratio of the pores in the obtained sheet is higher and luminance is improved. Although the reason for this is not known, it is thought to be due to an improvement in pore opening property resulting from improved interfacial peeling and release properties stemming from the high degree of crystallinity and an improvement in pore shape retention properties after pore opening resulting from a decrease in the degree of high-temperature deformation.

The heat of fusion ΔHm of the 4-methyl-1-pentene polymer (B) according to the present invention can be obtained within the range defined above by the production method mentioned later. Further, the melting point Tm can also be adjusted by adjusting the proportion of the 4-methyl-1-pentene constitutional unit in the requirement (a) described above.

Note that the requirement that the melting point (Tm) be not less than the lower limit value described above is preferable in terms of the dimensional stability and heat resistance of the obtained sheet, and the requirement that the melting point (Tm) be not more than the upper limit value described above is preferable in terms of the impact strength and toughness of the obtained sheet.

(Requirement (c))

The 4-methyl-1-pentene polymer (B) according to the present invention has a melt flow rate (MFR) measured under conditions of 260° C. and a 5 kg load in conformity to ASTM D1238 of 0.1 to 500 g/10 min, and preferably 100 to 500 g/10 min.

In terms of the dispersibility in the polyester when producing the molded article, it is preferable for the MFR to fall within the range described above.

The MFR can be adjusted by allowing hydrogen to coexist in the reactor during the polymerization reaction.

(Requirement (d))

The 4-methyl-1-pentene polymer (B) according to the present invention has a meso diad fraction (m) measured by $^{13}$C-NMR of 98.5 to 100%, and preferably 99 to 100%.

When the meso diad fraction (m) exceeds the lower limit value described above, the peeling and pore opening properties at the interface between the polyester (A) and the 4-methyl-1-pentene polymer (B) and the pore shape retention properties after pore opening are sufficient.

The meso-diad fraction (m) of the 4-methyl-1-pentene polymer (B) can be adjusted based on the type of olefin polymerization catalyst mentioned later.

(Requirement (e))

The 4-methyl-1-pentene polymer (B) according to the present invention preferably has a Vicat softening temperature measured at a rate of temperature increase of 50° C./hr at a test load of 10 N in a silicone oil in conformity to ASTM D1525 of 145 to 220° C., preferably 150 to 210° C., more preferably 155 to 200° C., and even more preferably 160 to 190° C.

It is preferable for the Vicat softening temperature to fall within the range described above, because shape retention properties at high temperature increase.

The Vicat softening temperature can be adjusted based on the type of olefin polymerization catalyst and the amount of the constitutional unit derived from at least one olefin selected from ethylene and α-olefins having 3 to 20 carbon atoms (except for 4-methyl-1-pentene).

(Requirement (f))

In the 4-methyl-1-pentene polymer (B) according to the present invention, the amount of a decane-soluble portion at 23° C. is 5% by weight or less, preferably 3% by weight or less, and more preferably 1% by weight or less. As mentioned in detail in Examples described later, the amount of a decane-soluble portion at 23° C. indicates the portion of the 4-methyl-1-pentene polymer (B) that dissolved in the n-decane solution side after heating to dissolve in n-decane at 145° C. for 1 hour and then cooling to 23° C.

When the amount of the decane-soluble portion at 23° C. falls within the range described above, the efflux of a low-molecular-weight component (contaminant component) can be suppressed, and the obtained polyester sheet can therefore be suitably used for applications that require high purity.

(Method for Producing 4-Methyl-1-Pentene Polymer (B))

The 4-methyl-1-pentene polymer (B) according to the present invention can be produced by, for example, the methods described in JP-A-2015-183141, JP-A-2016-098257, and WO 2014/050817(A1).

(Compatibilizing Agent (C))

The compatibilizing agent (C) used in the present invention is used for the purpose of adjusting the degree of dispersion of the 4-methyl-1-pentene polymer (B) in the polyester (A), and for the purpose of adjusting the interfacial peeling and pore opening properties.

There are no particular restrictions on the type and production method of the compatibilizing agent (C). For example, polystyrene, a styrene elastomer, or a polar group-modified styrene elastomer is used.

The styrene elastomer that can be used in the present invention has a monovinyl-substituted aromatic hydrocarbon (styrene aromatic hydrocarbon) as a copolymerization component. Specific examples thereof include a styrene-ethylene-butylene-styrene block copolymer (SEBS), a styrene-ethylene-propylene-styrene block copolymer (SEPS), a styrene-butylene-butadiene-styrene block copolymer (SBBS), a styrene-butadiene rubber (SBR), a styrene-isoprene rubber (SIR), a styrene-ethylene copolymer, a styrene-butadiene-styrene copolymer (SBS), a styrene-isoprene-styrene copolymer (SIS), poly($\alpha$-methylstyrene)-polybutadiene-poly($\alpha$-methylstyrene) ($\alpha$-MeSB$\alpha$-MeS), poly($\alpha$-methylstyrene)-polyisoprene-poly($\alpha$-methylstyrene) ($\alpha$-MeSI$\alpha$-MeS), and the like. Further examples include an aspect in which the conjugated diene compound constituting the copolymers exemplified above, specifically butadiene or isoprene, is hydrogenated. Of these, it is preferable to use styrene-butadiene rubber, styrene-isoprene rubber, styrene-hydrogenated butadiene rubber, and styrene-hydrogenated isoprene rubber.

Examples of the polar group-modified styrene elastomer include elastomers in which a part of the styrene elastomer is modified by a polar monomer. The elastomer may be modified by a conventionally known method.

Examples of the polar monomer used for modification include hydroxyl group-containing ethylenic unsaturated compounds, amino group-containing ethylenic unsaturated compounds, epoxy group-containing ethylenic unsaturated compounds, aromatic vinyl compounds, unsaturated carboxylic acids or derivatives thereof, vinyl ester compounds, vinyl chlorides, vinyl group-containing organosilicon compounds, carbodiimide compounds, and the like. Of these, unsaturated carboxylic acids or derivatives thereof are particularly preferred.

Examples of the unsaturated carboxylic acid or a derivative thereof include unsaturated compounds having one or more carboxylic acid groups, an ester of a compound having a carboxylic acid group and an alkyl alcohol, unsaturated compounds having one or more carboxylic anhydride groups, and the like. Examples of the unsaturated group include a vinyl group, a vinylene group, an unsaturated cyclic hydrocarbon group, and the like. These compounds are not particularly limited, and a conventionally known compound may be used. Specific examples of the compound include: unsaturated carboxylic acids such as acrylic acid, maleic acid, fumaric acid, tetrahydrophthalic acid, itaconic acid, citraconic acid, crotonic acid, isocrotonic acid, nadic acid [trademark] (endocis-bicyclo[2.2.1]hept-5-ene-2,3-dicarboxylic acid); and derivatives thereof such as an acid halide, amide, imide, anhydride, or ester. Specific examples of such derivatives include maleyl chloride, maleimide, maleic anhydride, citraconic anhydride, monomethyl maleate, dimethyl maleate, glycidyl maleate and the like. These unsaturated carboxylic acids and/or derivatives thereof can be used alone or in combination of two or more thereof. Among them, an unsaturated dicarboxylic acid or an acid anhydride thereof is preferable, and maleic anhydride is particularly preferably used. The polar group-modified styrene elastomer can be obtained by graft polymerization of usually 1 to 100 parts by mass of the polar monomer, and preferably 5 to 80 parts by mass of the polar monomer, based on 100 parts by mass of the styrene elastomer mentioned above.

A commercially available product can also be used as the polar group-modified styrene elastomer. Specific examples thereof include Dynaron (trademark, JSR Corporation) 8630P, Tuftec (trademark, manufactured by Asahi Kasei Corporation) M1913, and the like. The polar group-modified styrene elastomer can be used alone or in combination of two or more thereof.

The polar group-modified styrene elastomer used in the present invention preferably satisfies the following requirements (i) and (ii).

(i) Melt flow rate (MFR; JIS K 7210, 230° C., 2.16 kgf) is usually 1 to 100 g/10 min, and preferably 10 to 50 g/10 min. When the MFR falls within this range, melt viscosity and fluidity are close to those of the polyester (A) and the 4-methyl-1-pentene polymer (B), and good dispersibility is exhibited as a compatibilizing agent.

(ii) The styrene content is usually 1 to 35% by mass, and preferably 5 to 20% by mass. When the styrene content is less than 1% by mass, compatibility with the polyester (A) decreases. When the styrene content exceeds 35% by mass, the decrease in compatibility with the 4-methyl-1-pentene polymer (B) increases.

[Other Ingredients]

The polyester sheet of the present invention can optionally contain, to the extent that the effects of the present invention are not impaired, an additional resin or polymer and/or an additive for resins other than the polyester (A), the 4-methyl-1-pentene polymer (B), and the compatibilizing agent (C) mentioned above in accordance with the intended application.

In the case where the polyester sheet of the present invention contains another resin or polymer other than the components (A), (B), and (C) mentioned above, examples of the another resin or polymer include polystyrene, an acrylic resin, a polyphenylene sulfide resin, a polyether ether ketone resin, a polyester resin, polysulfone, polyphenylene oxide, polyimide, polyether imide, an acrylonitrile/butadiene/styrene copolymer (ABS), an ethylene/$\alpha$-olefin copolymer rubber, a conjugated diene rubber, a phenol resin, a melamine resin, a silicone resin, an epoxy resin, and the like.

In the case where the polyester sheet contains these other resins or polymers, the total content of the other resin or polymer is, based on a total of 100 parts by mass of the components (A), (B), and (C) mentioned above, preferably 0.1 to 30 parts by mass.

Examples of the additive for resins to be added to the polyester sheet of the present invention include pigments, dyes, fillers, lubricants, plasticizers, mold release agents, antioxidants, flame retardants, ultraviolet absorbers, antimicrobial agents, surfactants, antistatic agents, weathering stabilizers, heat stabilizers, anti-slip agents, antiblocking agents, foaming agents, crystallization aids, anti-fogging agents, (transparent) nucleating agents, antiaging agents, hydrochloric acid absorbers, impact modifiers, cross-linking agents, co-cross-linking agents, cross-linking aids, adhesives, softening agents, and processing aids. These additives can be used alone or in appropriate combination of two or more thereof.

Examples of the pigment include inorganic pigments (titanium oxide, iron oxide, chromium oxide, cadmium sulfide, etc.) and organic pigments (azo lake pigments, thioindigo pigments, phthalocyanine pigments and anthraquinone pigments). Examples of the dye include azo dyes, anthraquinone dyes, and triphenylmethane dyes. The amounts of the pigment and the dye added are not particularly limited, and the total amount thereof is usually 5 parts by mass or less, and preferably 0.1 to 3 parts by mass, with respect to a total of 100 parts by mass of the (A), (B), and (C) components mentioned above.

Examples of the filler include glass fiber, carbon fiber, silica fiber, metal (stainless, aluminum, titanium, copper, etc.) fiber, carbon black, silica, glass beads, silicates (calcium silicate, talc, clay, etc.), metal oxides (iron oxide, titanium oxide, alumina, etc.), carbonates of metals (calcium carbonate, barium carbonate), various metal (magnesium, silicon, aluminum, titanium, copper, etc.) powders, mica, and glass flake. These fillers may be used alone or in combination of two or more thereof.

Examples of the lubricant include waxes (carnauba wax, etc.), higher fatty acids (stearic acid, etc.), higher alcohols (stearyl alcohol, etc.), and higher fatty acid amides (stearic acid amide, etc.).

Examples of the plasticizer include aromatic carboxylic acid esters (dibutyl phthalate, etc.), aliphatic carboxylic acid esters (methyl acetyl ricinoleate, etc.), aliphatic dicarboxylic acid esters (adipic acid-propylene glycol polyester, etc.), aliphatic tricarboxylic acid esters (triethyl citrate, etc.), phosphoric acid triesters (triphenyl phosphate, etc.), epoxy fatty acid esters (epoxy butyl stearate, etc.), and petroleum resins.

Examples of the mold release agents include lower (C1 to C4) alcohol esters of higher fatty acids (butyl stearate, etc.), polyhydric alcohol esters of fatty acids (C4 to C30) (hydrogenated castor oil, etc.), glycol esters of fatty acids, and liquid paraffin.

Examples of the antioxidant include phenol antioxidants (2,6-di-t-butyl-4-methylphenol, etc.), polycyclic phenol antioxidants (2,2'-methylenebis(4-methyl-6-t-butylphenol), etc.), phosphorus antioxidants (tetrakis(2,4-di-t-butylphenyl)-4,4-biphenylene diphosphonate, etc.), and amine antioxidants (N,N-diisopropyl-p-phenylenediamine, etc.).

Examples of the flame retardant include organic flame retardants (nitrogen-containing flame retardants, sulfur-containing flame retardants, silicon-containing flame retardants, phosphorus-containing flame retardants, etc.) and inorganic flame retardants (antimony trioxide, magnesium hydroxide, zinc borate, red phosphorus, etc.).

Examples of the ultraviolet absorber include benzotriazole ultraviolet absorbers, benzophenone ultraviolet absorbers, salicylic acid ultraviolet absorbers, and acrylate ultraviolet absorbers.

Examples of the antimicrobial agent include quaternary ammonium salts, pyridine compounds, organic acids, organic acid esters, halogenated phenol, and organic iodine.

Examples of the surfactant can include nonionic, anionic, cationic and amphoteric surfactants. Examples of the nonionic surfactant include: polyethylene glycol-type nonionic surfactants such as higher alcohol ethylene oxide adducts, fatty acid ethylene oxide adducts, higher alkylamine ethylene oxide adducts, and polypropylene glycol ethylene oxide adducts; and polyhydric alcohol-type nonionic surfactants such as polyethylene oxide, fatty acid esters of glycerin, fatty acid esters of pentaerythritol, fatty acid esters of sorbitol or sorbitan, alkyl ethers of polyhydric alcohols, and aliphatic amides of alkanolamines. Examples of the anionic surfactant include: alkali metal salts of higher fatty acids; sulfuric acid ester salts; sulfonates such as alkylbenzenesulfonates, alkylsulfonates, and paraffin sulfonate; and phosphoric acid ester salts such as higher alcohol phosphoric acid ester salt. Examples of the cationic surfactant include quaternary ammonium salts such as alkyltrimethylammonium salts. Examples of the amphoteric surfactant include: amino acid-type amphoteric surfactants such as higher alkylaminopropionates; and betaine-type amphoteric surfactants such as higher alkyl dimethyl betaine and higher alkyl dihydroxyethyl betaine.

Examples of the antistatic agent include the surfactants described above, fatty acid esters, and polymer-type antistatic agents. Examples of the fatty acid ester include esters of stearic acid and oleic acid. Examples of the polymer-type antistatic agent include polyether ester amide.

The added amounts of these various additives (filler, lubricant, plasticizer, mold release agent, antioxidant, flame retardant, ultraviolet absorber, antimicrobial agent, surfactant, antistatic agent, etc.) may be appropriately selected in accordance with the intended use within a range that does not impair the object of the present invention. The added amounts of these additives are preferably, but not particularly limited to, 0.1 to 30 parts by mass with respect to a total of 100 parts by mass of the (A), (B), and (C) components mentioned above.

The polyester sheet of the present invention includes the polyester (A), the 4-methyl-1-pentene polymer (B), and the compatibilizing agent (C) in the predetermined blending ratio mentioned above, and as a result properly exhibits a state in which at least a part of the 4-methyl-1-pentene polymer (B) is finely and uniformly dispersed in the resin composition.

(Method for Producing Polyester Sheet)

The method for producing the polyester sheet of the present invention is not particularly limited. For example, the polyester sheet can be obtained by drying the polyester (A), then mixing the dried polyester (A), the 4-methyl-1-pentene polymer (B), the compatibilizing agent (C), and other optional components in the ratios mentioned above, melt-kneading the resultant mixture to obtain a polyester resin composition, and then molding the resultant polyester resin composition to obtain a polyester sheet. The melt-kneading is not particularly limited by its method and can be performed using a generally commercially available melt kneading apparatus such as an extruder.

When performing melt-kneading, for example, the cylinder temperature of a site where the kneading is performed in a kneading machine is usually 250 to 310° C., and preferably 260 to 290° C. If the temperature is lower than 250° C., kneading is insufficient due to insufficient melting, so that an improvement in the physical properties of the resin composition is not seen. On the other hand, if the temperature is higher than 310° C., thermal decomposition of the polyester (A), the 4-methyl-1-pentene polymer (B), and the compatibilizing agent (C) may occur, which can result in a deterioration in the physical properties of the resin composition. The kneading time is usually 0.1 to 30 minutes, and particularly preferably 1 to 5 minutes. If the kneading time is shorter than 0.1 minutes, sufficient melt kneading is not performed. If the kneading time exceeds 30 minutes, thermal decomposition of the polyester (A), the 4-methyl-1-pentene polymer (B), and the compatibilizing agent (C) may occur.

The polyester resin composition produced in this manner generally exhibits a state in which at least a part of the 4-methyl-1-pentene polymer (B) is finely dispersed in the resin composition.

The polyester sheet of the present invention can be produced by any known method for producing a sheet-shaped article from a resin composition without any particular limitation. Specifically, for example, the polyester sheet of the present invention can be preferably produced by stretching a sheet-shaped article (unstretched sheet) obtained by various molding methods, and more preferably by biaxially stretching a sheet-shaped article obtained by an extrusion molding method.

The method for producing the unstretched sheet is not particularly limited, and it can be carried out using a generally commercially available apparatus. The unstretched sheet can be prepared by, for example, drying pellets of a polyester resin composition composed of the polyester (A), 4-methyl-1-pentene polymer (B), compatibilizing agent (C) described above, and, if necessary, other optional components by vacuum drying or the like if necessary, then feeding the dried pellets to an extruder having a T-die, and performing extrusion molding. Alternatively, the polyester (A), the 4-methyl-1-pentene polymer (B), the compatibilizing agent (C), and the other components may each be fed to an extruder, the polyester resin composition may be prepared in the extruder, and then extrusion molding may be carried out to prepare the unstretched sheet. The unstretched sheet may be a single layer sheet or a laminated sheet including a layer of the polyester resin composition.

In the stretching process, the unstretched sheet is stretched using a stretching apparatus. Preferably, the unstretched sheet is biaxially stretched using a biaxial stretching apparatus. The sheet of the present invention obtained through the stretching process has many fine pores. In this stretching process, peeling occurs at the interface between the polyester (A) in the unstretched sheet composed of the polyester resin composition mentioned above and the 4-methyl-1-pentene polymer (B) finely dispersed in the polyester (A), and as a result a large number of fine pores are formed in the polyester sheet.

The stretching conditions are not particularly limited. For example, when polyethylene terephthalate is used as the polyester (A), it is preferable to heat the unstretched sheet to 70 to 90° C., and then stretch the unstretched sheet by a factor of 2 to 5 in the longitudinal direction and by a factor of 2 to 5 in the direction perpendicular to the longitudinal direction. The stretching method is not particularly limited, and the stretching can be carried out using a generally commercially available apparatus. Further, when biaxial stretching is carried out, either a method of sequential stretching in the longitudinal direction and the direction perpendicular to the longitudinal direction, or a method of simultaneously stretching in the longitudinal direction and the perpendicular direction may be employed.

In order to enhance mechanical strength, dimensional stability and the like, it is preferable to subsequently subject the stretched sheet to a heat treatment at 150 to 240° C. for 1 to 120 seconds in a state where the sheet end portions are fixed with clips or the like to promote oriented crystallization and remove stretching strain. This heat treatment process is also called heat setting. During the heat treatment process, a 1 to 10% relaxation treatment may be optionally applied in the longitudinal direction and the perpendicular direction.

Further, a coating layer may be provided on the sheet obtained through the stretching process in order to impart functions such as photostability and anti-blocking properties. In addition, the polyester sheet of the present invention may be formed as a laminate with the same type or another type of sheet.

[Shape and Properties of Polyester Sheet]

The thickness of the polyester sheet of the present invention is not particularly limited, but in practice a thickness that falls within the range of 0.001 mm to 10 mm is preferable. The luminance measured under the conditions mentioned later preferably falls within the range of 40 to 100%.

Since the polyester sheet of the present invention is obtained using a resin composition having much better pore opening properties and peeling properties in the vicinity of the finely dispersion phase compared with conventional polyester sheets, the fine pores can be uniformly dispersed. It is also expected that not only are the light reflectivity and the light scuttering properties excellent, but also that uniform properties are exhibited over the whole surface without there being any holes or parts having reduced strength and the like.

[Applications of Polyester Sheet]

The polyester sheet of the present invention can be used without restriction in conventional polyester sheet applications. However, due to its excellent light reflection performance, the polyester sheet of the present invention can be suitably used in various reflective sheet applications, such as a reflective sheet of a flat type image display device such as a liquid crystal display, a reflective sheet of an illuminated sign, or a back reflective sheet of a solar cell.

EXAMPLES

The present invention will now be described in more detail with reference to Examples. However, the present invention is not limited by these Examples. The measurement methods used in the Examples and Comparative Examples of the present invention were as follows.

[Comonomer Content]

The content of the constitutional unit derived from at least one α-olefin (comonomer) selected from ethylene and α-olefins having 3 to 20 carbon atoms (except for 4-methyl-1-pentene) in the 4-methyl-1-pentene polymer was calculated from $^{13}$C-NMR spectra using the following apparatus and conditions.

The measurement was performed using AVANCE III cryo-500 nuclear magnetic resonance apparatus manufactured by Bruker BioSpin under the following conditions: solvent: an o-dichlorobenzene/benzene-$d_6$ (4/1 v/v) mixed solvent; sample concentration: 55 mg/0.6 mL; measurement temperature: 120° C.; observed nucleus: $^{13}$C (125 MHz); sequence: single-pulse proton broadband decoupling; pulse width: 5.0 μsec (45° pulse), repetition time: 5.5 sec; the number of integrations: 64; and chemical shift reference value: 128 ppm of benzene-$d_6$. The comonomer content was calculated using an integrated value of the backbone methine signals according to the following expression.

Comonomer content (%)=[P/(P+M)]×100 wherein P represents the total peak area of comonomer backbone methine signals, and M represents the total peak area of 4-methyl-1-pentene backbone methine signals.

[Melting Point (Tm) and Heat of Fusion (ΔHm)]

An aluminum pan for measurement was covered with approximately 5 mg of a sample, and the temperature was increased to 280° C. at 10° C./min using a DSC measurement apparatus manufactured by Seiko Instruments Inc. (DSC220C). The temperature was kept at 280° C. for 5 minutes and then decreased to 20° C. at 10° C./min. The temperature was kept at 20° C. for 5 minutes and then increased to 280° C. at 10° C./min. A temperature at which the summit of a crystal melting peak observed in the second temperature increase was referred to as the melting point (Tm). The heat of fusion ΔHm was calculated from the integrated value of this crystal melting peak.

[Melt Flow Rate (MFR)]

The melt flow rate (MFR) was measured under conditions of 260° C. and a 5 kg load in conformity to ASTM D1238.

[Meso Diad Fraction]

The meso diad isotacticity (meso diad fraction) (m) of the 4-methyl-1-pentene polymer was defined as the fraction of isobutyl branches having the same orientation when the head-to-tail linkage of arbitrary two 4-methyl-1-pentene units in the polymer chain is expressed by planar zigzag arrangement, and determined from $^{13}$C-NMR spectra according to the following expression.

Meso diad isotacticity (m) (%)=[m/(m+r)]×100 wherein m and r each represent absorption intensity derived from the backbone methylenes of head-to-tail linked 4-methyl-1-pentene units represented by the formula given below.

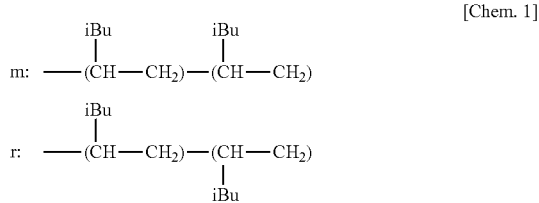

[Chem. 1]

The $^{13}$C-NMR spectra were measured using AVANCE III cryo-500 nuclear magnetic resonance apparatus manufactured by Bruker BioSpin under the following conditions: solvent: an o-dichlorobenzene/benzene-$d_6$ (4/1 v/v) mixed solvent; sample concentration: 60 mg/0.6 mL; measurement temperature: 120° C.; observed nucleus: $^{13}$C (125 MHz); sequence: single-pulse proton broadband decoupling; pulse width: 5.0 μsec (45° pulse), repetition time: 5.5 sec; and chemical shift reference value: 128 ppm of benzene-$d_6$.

Peak regions were classified into a first region on a high-magnetic field side and a second region on a low-magnetic field side by delimiting a region of 41.5 to 43.3 ppm at the local minimum point of a peak profile.

In a first region, the backbone methylenes in the linkage of the two 4-methyl-1-pentene units represented by (m) resonated, and the integrated value of these units regarded as a 4-methyl-1-pentene homopolymer was referred to as "m". In a second region, the backbone methylenes in the linkage of the two 4-methyl-1-pentene units represented by (r) resonated, and the integrated value thereof was referred to as "r". A value less than 0.01% was equal to or lower than the detection limit.

[Decane-Soluble Portion]

200 mL of n-decane was added to a 5 g of a 4-methyl-1-pentene polymer sample, which was then dissolved by heating at 145° C. for 1 hour. The mixture was cooled to 23° C. and left for 30 minutes. Then, precipitates (n-decane-insoluble portion) were filtered off. The filtrate was placed in approximately 3-fold amount of acetone to precipitate the component dissolved in n-decane. The precipitates were filtered off from acetone and then dried. No residue was observed even when the filtrate was concentrated to dryness. The amount of the n-decane-soluble portion was determined according to the following expression.

Amount of the *n*-decane-soluble portion(% by weight)=[Precipitate weight/Sample weight]×100

[Measurement Method of Average Dispersion Size and Maximum Particle Size of 4-Methyl-1-Pentene Polymer (B) in Unstretched Sheet]

The size of the dispersion phase of the 4-methyl-1-pentene polymer (B) in the unstretched sheet was observed by cutting out a cross-section (end view, cross-section in the sheet TD direction) of the obtained sheet using an SEM. The average dispersion size of the dispersion phase was taken as the average value of 10 arbitrary dispersion phases confirmed by SEM. As the maximum particle size, the largest value of the average value of the maximum size and the minimum size among the particles observed in a visual field of 60 μm×70 μm was used.

[Measurement Method of Average Pore Area of Stretched Sheet]

A cross-section (end view, cross-section in the sheet TD direction) of the obtained stretched sheet was cut out and observed using an SEM. The average pore area was taken as the average of 10 arbitrary pores confirmed by SEM.

[Measurement Method of Light Reflectance (Luminance) of Stretched Sheet]

The light reflectance of the stretched sheet was measured using a spectrophotometer (manufactured by Hitachi High-Tech Science). The light reflectance at a wavelength of 550 nm in the longitudinal direction and the direction perpendicular to the longitudinal direction were measured and the average value thereof was used.

Example 1

<Production of 4-Methyl-1-Pentene Polymer (B)>

A SUS polymerization vessel (internal capacity: 1 L) equipped with an agitator was charged with 425 mL of purified decane and 0.5 mL (1 mol) of a decane solution of diisobutyl aluminum hydride (2.0 mmol/mL based on an aluminum atom) at room temperature under a stream of nitrogen. Subsequently, 0.0005 mmol (based on a zirconium atom) of the preceding decane slurry solution (C) of the prepolymerization catalyst component prepared was added thereto, and 50 NmL of hydrogen was charged thereinto (first hydrogen charging). Subsequently, the polymerization vessel was continuously charged with a mixed solution of 250 mL of 4-methyl-1-pentene and 3.3 mL of 1-decene at a given rate over 2 hours. The start of this charging was referred to as the start of polymerization. The temperature was increased to 45° C. over 30 minutes from the start of polymerization and then kept at 45° C. for 4 hours. 50 NmL of hydrogen was charged thereinto 1 hour and 2 hours, respectively, after the start of polymerization (second hydrogen charging). After a lapse of 4.5 hours from the start of polymerization, the temperature was decreased to room temperature, followed by depressurization. Immediately thereafter, the polymerization solution containing a white solid was filtered to obtain a solid substance. This solid substance was dried under reduced pressure at 80° C. for 8 hours to obtain a polymer [B-1]. The yield was 131 g. Results of measuring $^{13}$C-NMR, GPC, MFR and a decane-soluble portion of the polymer [B-1] are shown in Table 1.

<Kneading of Polyester Resin Composition>

Polyethylene terephthalate (Mitsui PET, manufactured by Mitsui Chemicals, Inc., brand name: J005PC, IV=0.62 dl/g) as the polyester (A) was dried at 150° C. for 16 hours using a vacuum dryer. 80 parts by mass of the dried polyethylene terephthalate, 15 parts by mass of the polymer [B-1] mentioned above as the 4-methyl-1-pentene polymer (B), and 5 parts by mass of a polar group-modified styrene-ethylene/butylene-styrene copolymer (manufactured by JSR Corporation, brand name: Dynaron 8630P, MFR (JIS K 7210, 230°

C., 2.16 kgf): 15 g/10 min, density: 0.89 g/cm³, styrene content: 15%) as the compatibilizing agent (C) were blended in that composition ratio.

The mixture was further melt-kneaded using a twin screw extruder (manufactured by Technovel Corporation, φ=25 mm, L/D=40, cylinder temperature: 270° C., screw rotation speed: 1800 rpm) to prepare an unstretched sheet having a thickness of 100 μm.

<Preparation of Stretched Sheet>

The unstretched sheet was heated to 100° C. using a biaxial stretching apparatus (manufactured by Bruckner), and was then sequentially stretched by a factor of 3 in the longitudinal direction and a factor of 3 in the direction perpendicular to the longitudinal direction at a stretching speed of 300 mm/second. The stretched sheet was subjected to a heat treatment at 200° C. for 60 seconds. The thickness of the stretched sheet was 11 μm, and the light reflectance at a wavelength of 550 nm was 56%.

Comparative Example 1

Granulation and film formation were performed in the same manner as in the [Example 1] mentioned above, except that a 4-methyl-1-pentene/1-decene copolymer (TPX (registered trademark) manufactured by Mitsui Chemicals, Inc., brand name: DX 820, melting point: 233° C., MFR (ASTM D 1238, 260° C., 5 kgf): 180 g/10 min) was used as the 4-methyl-1-pentene polymer. The thickness of the stretched sheet was 12.5 μm, and the light reflectance at a wavelength of 550 nm was 53%. It can be seen that the stretched film of Example 1 had a larger average pore area and a higher light reflectance.

Comparative Example 2

Granulation and film formation were performed in the same manner as in the Example 1 mentioned above, except that a 4-methyl-1-pentene/1-decene copolymer (TPX (registered trademark) manufactured by Mitsui Chemicals, Inc., brand name: DX 818, melting point: 232° C., MFR (ASTM D 1238, 260° C., 5 kgf): 28 g/10 min) was used as the 4-methyl-1-pentene polymer. The thickness of the stretched sheet was 11.5 μm, and the light reflectance at a wavelength of 550 nm was 40%.

As can be seen from the fact that the pre-stretched sheet had a large maximum particle size, there was large unevenness in the dispersed particle size of the dispersion phase in the pre-stretched sheet, and the state of the pores in obtained stretched sheet was not uniform. This is presumed to have caused a decrease in luminance.

Comparative Example 3

Granulation and film formation were performed in the same manner as in the Example 1 mentioned above, except that homopolypropylene (Prime Polypro (registered trademark), brand name: J108M, was used in place of the 4-methyl-1-pentene polymer. The thickness of the stretched and heat-set stretched sheet was 11.5 μm, and the light reflectance at a wavelength of 550 nm was 35%. The PP melted in the heat setting process (heat treatment process), from which it is presumed that the holes that had once opened closed.

TABLE 1

| | | Units | Example 1 | Comparative Example 1 | Comparative Example 2 | Comparative Example 3 |
|---|---|---|---|---|---|---|
| Polymer Physical Properties | Polymer | | [B-1] | DX820 | DX818 | J108M |
| | 4-Methyl-1-Pentene Amount | % by mol | 98.7 | 98.4 | 98.4 | ND |
| | Comonomer Type | — | 1-decene | 1-decene | 1-decene | ND |
| | Content of Comonomer-Derived Constitutional Unit | % by mol | 1.3 | 1.6 | 1.5 | ND |
| | Meso Diad Isotacticity (m) | % | 99.4 | 97.5 | 97.5 | ND |
| | Decane-Soluble Portion at 23° C. | wt % | 0.1 | 5.1 | 5.0 | ND |
| | MFR (260° C., 5 kg) | g/10 min | 190 | 200 | 28 | ND |
| | Melting Point (Tm) | ° C. | 235 | 233 | 232 | 156 |
| | Value of (0.5 × Tm − 76) | — | 41.5 | 41 | 40 | 2 |
| | Heat of Fusion (ΔHm) | J/g | 46 | 39 | 38 | ND |
| Physical Properties of Pre-stretched Sheet | Average Particle Size | μm | 1.6 | 2.0 | 2.2 | 1.9 |
| | Maximum Particle Size | μm | 5.4 | 5.6 | 15.0 | 6.1 |
| Physical Properties of Stretched Sheet | Average Pore Area | μm² | 10.4 | 9.3 | 20.7 | 8.2 |
| | Luminance | % | 56 | 53 | 40 | 35 |

In Table 1, ND means no data.

The invention claimed is:

1. A polyester sheet comprising a polyester (A), a 4-methyl-1-pentene polymer (B), and a compatibilizing agent (C), wherein content proportions of the (A), (B), and (C) are 60 to 98.9 parts by mass for (A), 1 to 25 parts by mass for (B), and 0.1 to 15 parts by mass for (C), when a total content of (A), (B), and (C) is set as 100 parts by mass, and wherein the (B) satisfies the following requirements (a) to (d):

(a) an amount of a constitutional unit derived from 4-methyl-1-pentene is 100 to 90% by mol and a total amount of constitutional units derived from at least one α-olefin selected from ethylene and α-olefins having 3 to 20 carbon atoms (except for 4-methyl-1-pentene) is 0 to 10% by mol;

(b) a heat of fusion ΔHm (units: J/g) and a melting point Tm (units: ° C.) measured by differential scanning calorimetry (DSC) satisfy the following requirements (1) and (2):

$$\Delta Hm \geq 0.5 \times Tm - 76 \tag{1}$$

Melting point $Tm$: 200 to 260° C.; (2)

(c) a melt flow rate (MFR) measured under conditions of 260° C. and a 5 kg load in conformity to ASTM D1238 is 0.1 to 500 g/10 min; and (d) a meso diad fraction (m) measured by $^{13}$C-NMR is 98.5 to 100%.

2. The polyester sheet according to claim 1, wherein the (B) satisfies at least one of the following requirements (e) and (f):

(e) a Vicat softening temperature measured at a rate of temperature increase of 50° C./hr at a test load of 10 N in a silicone oil in conformity to ASTM D1525 is 145 to 220° C.; and (f) an amount of a decane-soluble portion at 23° C. is 5% by weight or less.

3. The polyester sheet according to claim 1, wherein the 4-methyl-1-pentene polymer (B) has a melting point Tm of 230 to 245° C.

4. The polyester sheet according to claim 1, wherein the polyester (A) is polyethylene terephthalate.

5. The polyester sheet according to claim 1, wherein the polyester sheet is obtained through a stretching process.

6. The polyester sheet according to claim 1, wherein the (C) is a polar group-modified styrene elastomer.

7. The polyester sheet according to claim 6, wherein the polar group-modified styrene elastomer is a polar group-modified styrene-ethylene/butylene-styrene copolymer.

8. The polyester sheet according to claim 6, wherein the polar group-modified styrene elastomer has a styrene content falling within the range of 5 to 20% by mass.

9. The polyester sheet according to claim 1, wherein the polyester sheet is a biaxially stretched sheet.

10. The polyester sheet according to claim 1, wherein the polyester sheet is a reflective sheet of a liquid crystal display, an illuminated sign, or a solar cell.

* * * * *